United States Patent [19]

Niwa et al.

[11] Patent Number: 5,489,808
[45] Date of Patent: Feb. 6, 1996

[54] ELECTRIC CIRCUIT SUBSTRATE APPARATUS

[75] Inventors: Takashi Niwa, Nishikamo; Kenichi Kaneko, Kariya; Osamu Matsubara, Anjo; Katsuhiko Yamamoto, Kariya, all of Japan

[73] Assignee: Aisin Seiki Kabushiki Kaisha, Kariya, Japan

[21] Appl. No.: 437,047

[22] Filed: May 9, 1995

Related U.S. Application Data

[63] Continuation of Ser. No. 35,331, Mar. 19, 1993, abandoned.

[30] Foreign Application Priority Data

Mar. 23, 1992 [JP] Japan ..................... 4-065288

[51] Int. Cl.$^6$ ..................................... H01H 35/00
[52] U.S. Cl. .................. 307/116; 307/95; 307/118; 361/286; 361/783; 73/335.04
[58] Field of Search ..................... 361/282, 286, 361/783; 307/95, 116, 117, 118; 340/602; 324/663, 670; 73/335.04, 335.01, 335.02, 335.03

[56] References Cited

U.S. PATENT DOCUMENTS 3,987,676 10/1976 Bennewitz ..................... 73/335.04
4,700,082 10/1987 Oguma et al. ..................... 307/116
4,814,943 3/1989 Okuaki ..................... 361/783

OTHER PUBLICATIONS

Industrie-Elektrik+Elektronik, 22. Jahrgang 1977, No. 6, Von E. Heitz, "Vergubmassen in der Elektrotechnik", pp. 117–120.

Primary Examiner—William M. Shoop, Jr.
Assistant Examiner—Peter Ganjoo
Attorney, Agent, or Firm—Oblon, Spivak, McClelland, Maier & Neustadt

[57] ABSTRACT

An electric circuit substrate apparatus having a microprocessor for a control of a device is comprised of a substrate, an electric circuit arranged on the substrate and including a rectifier, an electrolysis condenser, a detecting device for detecting the voltage of a current outputted from the electrolysis condenser and the micro-processor which is set to stop the control of the device upon receipt of a signal from the detecting device, and an enclosing device for immersing therein the substrate and the electric circuit, except for a portion of electrolysis condenser, in order that the immersed elements are interrupted from the ambient air.

7 Claims, 2 Drawing Sheets

SMOOTH WAVE CURRENT

FULL-WAVE CURRENT

ELECTRIC CIRCUIT SUBSTRATE APPARATUS

This application is a Continuation of application Ser, No. 08/035,331, filed Mar. 19, 1993, now abandoned.

BACKGROUND OF THE INVENTION

The present invention relates to an electric circuit substrate apparatus.

In general, an electrically operated device includes an electric circuit substrate apparatus. The electric circuit substrate apparatus is composed of plural electric components arranged on a common substrate. In order to protect each of the electric components from humidity, the device is also provided with a circuit breaker for automatically interrupting the flow of an electric current from a power supply to a load such as a micro-processor before the load malfunction. This device is shown in the U.S. Pat. No. 4,700,082.

However, in the device disclosed in the foregoing United States Patent, the circuit breaker per se is relatively large in scale, which results in that the substrate on which the circuit breaker and related components are arranged becomes larger.

SUMMARY OF THE INVENTION

It is, therefore, a primary object of the present invention to provide an electric circuit substrate apparatus without the aforementioned drawback.

Another object of the present invention is to provide an electric circuit substrate apparatus having a fail-safe function which is compact in construction.

In order to attain the foregoing objects, an electric circuit substrate apparatus having a micro-processor for a control of a device is comprised of a substrate, an electric circuit arranged on the substrate and including a rectifier, an electrolysis condenser, a detecting device for detecting the voltage of a current outputted from the electrolysis condenser and the micro-processor which is set to stop the control of the device upon receipt of a signal from the detecting device, and an enclosing device for immersing therein the substrate and the electric circuit, except for a portion of electrolysis condenser, in order that the immersed elements ;ire interrupted from the ambient air.

BRIEF DESCRIPTION OF THE DRAWINGS

The above and other objects, features and advantages of the present invention will be more apparent and more readily appreciated from the following detailed description of preferred exemplarily embodiment of the present invention, taken in connection with the accompanying drawings, in which.

DESCRIPTION OF THE PREFERRED EMBODIMENT

A preferred embodiment of the present invention will be described hereinunder in detail with reference to the accompanying drawings.

Figure 1:
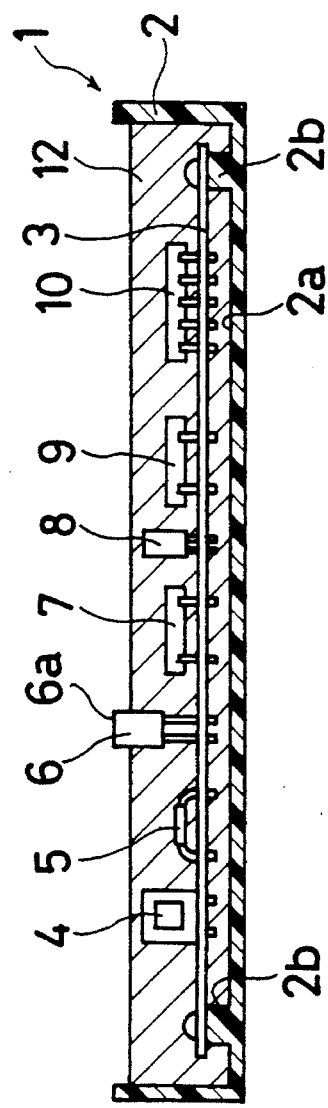
FIG. 1 is a cross-sectional view of one embodiment of an electric circuit substrate apparatus according to the present invention.
Figure 2:
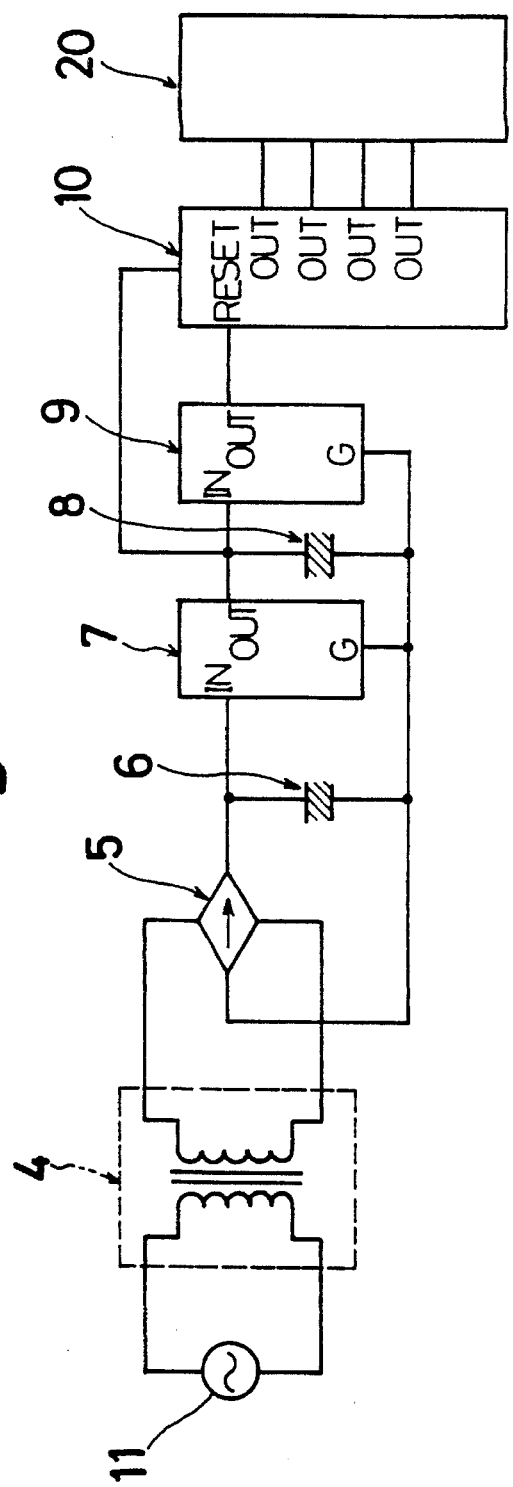
FIG. 2 is a diagram of a circuit whose components are arranged on the circuit substrate apparatus in FIG. 1.
Figure 3:
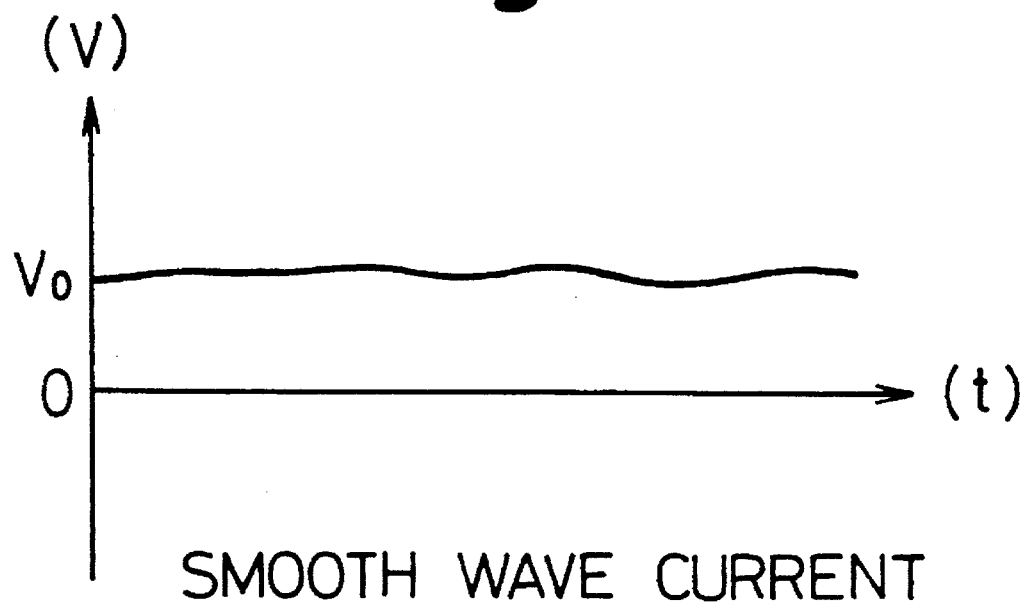
FIG. 3 is a graph showing a wave of an output from a condenser which is in order.

Referring to FIGS.1 to 4 inclusive, an electric circuit substrate apparatus 1 according to one embodiment of the present invention includes a casing 2. The casing 2 has a bottom wall 2a provided thereon with a plurality of upward projections 2b (only two are shown). On the projections 2b, a substrate 3 is fixedly mounted. On the substrate 3, a transformer 4, a diode bridge 5, an electrolysis condenser 6, regulator 7, a condenser 8, a reset IC 9, a micro-processor 10, and other components are arranged which constitute an electric circuit as shown in FIG. 2. In detail, an alternating current from an AC power supply 11 is set to be dropped to a voltage, and the resultant current is made into a full-wave rectification at the diode bridge 5. The rectified current is, then, set to be smoothed at the electrolysis condenser 6 as a smoothing device. The resultant or smoothed voltage is brought into a smoothed wave shape as shown in FIG.3, and is set to be fed, via the reset IC 9, to the micro-processor 10. The foregoing circuit is so designed as to control a hot-water supply means 20 of a sanitary device which is constructed in such a manner that an amount of hot-water is set to be supplied to a nozzle so as to be injected therefrom toward the anus of a male/female person or the pubic portion of a female person sitting on a toilet-bowl seat.

Figure 4:
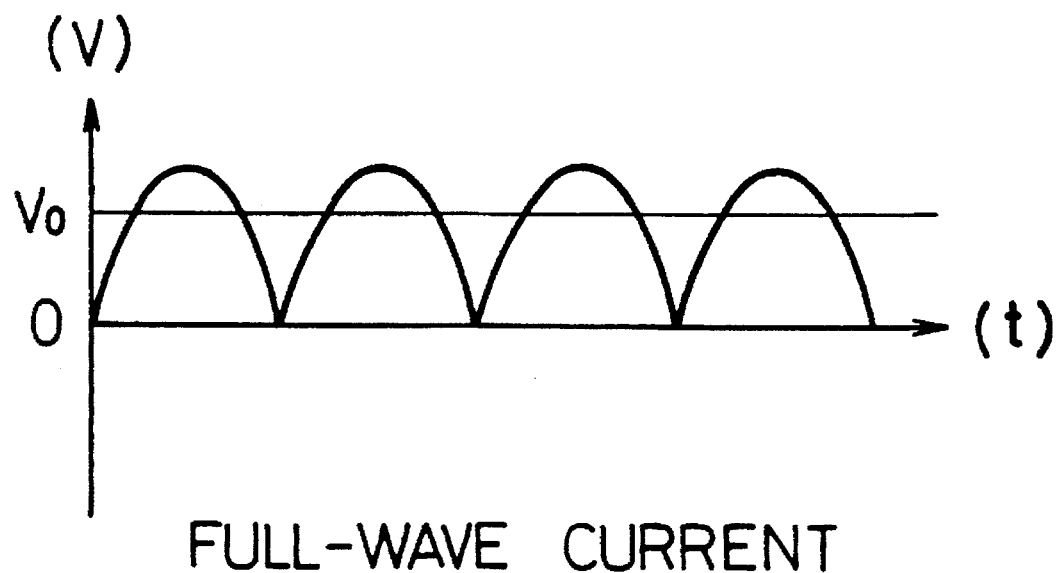
FIG. 4 is a graph showing a wave of an output From a condenser which is out of order.

The electric components, except for the electrolysis condenser 6, on the substrate 3 are immersed within a synthetic resin 12 which is solidified after being poured or supplied into the casing 2. Only a head portion 6a of the electrolysis condenser 6 remains an exposed condition within the atmosphere or the ambient air. The resulting structure protects the electric components other than the electrolysis condenser 6 from humidity and/or rapid change in temperature therearound, which results in no condensation. However, since the head portion 6a of the electrolysis condenser 6 is continually exposed to the atmosphere or the ambient air which usually includes an acid, in the long run, the raw material of the outer portion of the condenser 6 which is aluminum for example corrodes, which leads to that the condenser 6 becomes the damaged faster than that of another component. Thus, the smoothing function is ceased upon damage of the condenser 6, and a full-wave rectification current shown in FIG. 4 is set to be supplied, instead of the smooth wave current shown in FIG. 3, to the reset IC 9. As soon as the the reset IC 9 detects the lowest voltage of the full-wave rectification current, the malfunctional condition at the condenser 6 is set to be transmitted or informed to the micro-processor 10. Immediately upon receipt of this information, the micro-processor 10 begins to stop the operation of the hot-water supply means 20 of the sanitary device. This stop reveals the malfunction or damage of the condenser 6.

It is to be noted that instead of the reset IC 9 the micro-processor 10 can be provided with a function for detecting the malfunction of the condenser 6. Such structure can omit the reset IC 9, of course.

In accordance with the present invention, the condenser is brought into malfunction at first and no other electric component whose damage may bring an unexpected operation of the hot-water supply means 20 of the sanitary device remains in order, which assures no raise PL issues. In addition, the failure of the electric device by the malfunction of the condenser can inform the coming the life-time of each of other components or the electric device per se to the user.

It should be apparent to one skilled in the art that the above-described embodiments are merely illustrative of but a few of the many possible specific embodiments of the present invention. Numerous and various other arrangements can be readily devised by those skilled in the art without departing from the spirit and scope of the invention as defined in the following claims.

What is claimed is:

1. An electric circuit substrate apparatus having a micro-processor for a control of a device comprising:

a substrate;

an electric circuit arranged on the substrate and including the micro-processor, a rectifier, an electrolysis condenser, and a detecting means for detecting the voltage of a current outputted from the electrolysis condenser; the micro-processor is set to stop the control of the device upon receipt of a signal from the detecting means; and enclosing means for immersing therein the substrate and the electric circuit, except for a portion of the electrolysis condenser, in order that the immersed elements are interrupted from the ambient air;

wherein the portion of the electrolysis condenser to be exposed to the ambient air is a head of the electrolysis condenser, and wherein the raw material of the head of the electrolysis condenser is aluminum.

2. An electric circuit substrate apparatus according to claim 1, wherein the enclosing means is a solidification of an amount of synthetic resin.

3. An electric circuit substrate apparatus according to claim 1, wherein the detecting means is in the form of a reset IC.

4. An electric circuit substrate apparatus according to claim 1, wherein the detecting means is a part of the micro-processor.

5. An electric circuit substrate apparatus according to claim 1 further comprising a casing for accommodating therein the substrate, the electric circuit, and the enclosing means.

6. An electric circuit substrate apparatus having a micro-processor for controlling a device, comprising:

a substrate;

an electric circuit arranged on the substrate including:

a condenser for smoothing an input voltage waveform to said apparatus;

a detector for detecting a voltage output by said condenser; and a sealant covering said electric circuit except for a portion of said condenser;

said detector outputting a signal to said micro-processor for causing said micro-processor to disable operation of said device;

wherein:

said sealant prevents exposure of electric circuit from ambient air except for said portion of said condenser; and said portion of said condenser is made of a material which corrodes due to exposure to said ambient air.

7. An electric circuit substrate apparatus according to claim 6, wherein said detector output said signal if said voltage output by said condenser fals below a predetermined value.

* * * * *